US010926464B2

(12) United States Patent
Chaffins et al.

(10) Patent No.: US 10,926,464 B2
(45) Date of Patent: *Feb. 23, 2021

(54) MATERIAL SETS

(71) Applicant: Hewlett-Packard Development Company, L.P., Houston, TX (US)

(72) Inventors: Sterling Chaffins, Corvallis, OR (US); Kevin P. DeKam, Corvallis, OR (US)

(73) Assignee: Hewlett-Packard Development Company, L.P., Spring, TX (US)

(*) Notice: Subject to any disclaimer, the term of this patent is extended or adjusted under 35 U.S.C. 154(b) by 196 days.

This patent is subject to a terminal disclaimer.

(21) Appl. No.: 16/064,994

(22) PCT Filed: Apr. 15, 2016

(86) PCT No.: PCT/US2016/027973
§ 371 (c)(1),
(2) Date: Jun. 21, 2018

(87) PCT Pub. No.: WO2017/180164
PCT Pub. Date: Oct. 19, 2017

(65) Prior Publication Data
US 2019/0001567 A1    Jan. 3, 2019

(51) Int. Cl.
*B29C 64/209* (2017.01)
*B33Y 70/00* (2020.01)
*B33Y 30/00* (2015.01)
*B33Y 80/00* (2015.01)
*B29C 64/165* (2017.01)
*C09D 11/54* (2014.01)
*B29C 64/264* (2017.01)
*B22F 3/00* (2021.01)

(52) U.S. Cl.
CPC ............ *B29C 64/209* (2017.08); *B22F 3/008* (2013.01); *B29C 64/165* (2017.08); *B29C 64/264* (2017.08); *B33Y 30/00* (2014.12); *B33Y 70/00* (2014.12); *B33Y 80/00* (2014.12); *C09D 11/54* (2013.01)

(58) Field of Classification Search
CPC ... B29C 64/209; B29C 64/165; B29C 64/264; B22F 3/008; B33Y 80/00; B33Y 30/00; H05K 3/12
USPC .................................................. 523/160, 161
See application file for complete search history.

(56) References Cited

U.S. PATENT DOCUMENTS

| 6,363,606 | B1* | 4/2002 | Johnson, Jr. .......... B33Y 10/00 29/854 |
| 2006/0118990 | A1 | 6/2006 | Dierkes et al. |
| 2007/0238056 | A1* | 10/2007 | Baumann ................ B22F 3/008 430/325 |
| 2008/0052904 | A1 | 3/2008 | Schneider et al. |
| 2010/0089627 | A1 | 4/2010 | Huang et al. |
| 2012/0092105 | A1 | 4/2012 | Weinberg et al. |
| 2014/0035995 | A1 | 2/2014 | Chou et al. |
| 2014/0036455 | A1 | 2/2014 | Napadensky |
| 2014/0255666 | A1 | 9/2014 | Stucker et al. |
| 2014/0268604 | A1 | 9/2014 | Wicker et al. |
| 2015/0069649 | A1 | 3/2015 | Bai et al. |
| 2015/0077215 | A1 | 3/2015 | Ranky et al. |
| 2015/0110911 | A1 | 4/2015 | Snyder |
| 2015/0201500 | A1 | 7/2015 | Shinar et al. |
| 2015/0328835 | A1 | 11/2015 | Wu et al. |
| 2015/0352784 | A1 | 12/2015 | Lechmann et al. |
| 2015/0366073 | A1 | 12/2015 | Magdassi et al. |
| 2016/0007474 | A1 | 1/2016 | Dardona et al. |
| 2016/0039145 | A1 | 2/2016 | Steiner |
| 2016/0096324 | A1 | 4/2016 | Giller |

FOREIGN PATENT DOCUMENTS

| CN | 101146877 | 3/2008 |
| EP | 2001656 | 10/2014 |
| WO | WO-2008102266 | 8/2008 |
| WO | WO-2009017648 | 2/2009 |
| WO | WO-2014200595 | 12/2014 |
| WO | WO-2014209994 | 12/2014 |
| WO | WO-2015061332 | 4/2015 |
| WO | WO-2015/136278 A1 | 9/2015 |
| WO | WO-2015157433 | 10/2015 |
| WO | WO-2016012753 | 1/2016 |

OTHER PUBLICATIONS

Ivanova et al., Additive manufacturing (AM) and nanotechnology: Promises and challenges, Rapid Prototyping Journal, vol. 19, No. 5, pp. 353-364, Jul. 2013.
Jones et al., Printed Circuit Boards by Selective Deposition and Processing, Department of Engineering, De Montfort University, Leicester, England, pp. 639-656, 2011.
Woo et al., Ink-Jet Printing of Cu—Ag-Based Highly Conductive Tracks on a Transparent Substrate, Langmuir, vol. 25, No. 1, 2009.

* cited by examiner

*Primary Examiner* — Doris L Lee
(74) *Attorney, Agent, or Firm* — Thorpe, North, Western LLP

(57) ABSTRACT

The present disclosure is drawn to material sets for 3-dimensional printing. The material set can include a thermoplastic polymer powder having an average particle size from 20 μm to 100 μm, a conductive fusing ink comprising a transition metal, and second fusing ink. The second fusing ink can include a fusing agent capable of absorbing electromagnetic radiation to produce heat. The second fusing ink can provide a lower conductivity than the conductive fusing ink when printed on the thermoplastic polymer powder.

13 Claims, 4 Drawing Sheets

MATERIAL SETS

BACKGROUND

Methods of 3-dimensional (3D) digital printing, a type of additive manufacturing, have continued to be developed over the last few decades. Various methods for 3D printing have been developed, including heat-assisted extrusion, selective laser sintering, photolithography, as well as others. In selective laser sintering, for example, a powder bed is exposed to point heat from a laser to melt the powder wherever the object is to be formed. This allows for manufacturing complex parts that are difficult to manufacture using traditional methods. However, systems for 3D printing have historically been very expensive, though those expenses have been coming down to more affordable levels recently. In general, 3D printing technology improves the product development cycle by allowing rapid creation of prototype models for reviewing and testing. Unfortunately, the concept has been somewhat limited with respect to commercial production capabilities because the range of materials used in 3D printing is likewise limited. Therefore, research continues in the field of new techniques and materials for 3D printing.

Figure 1:
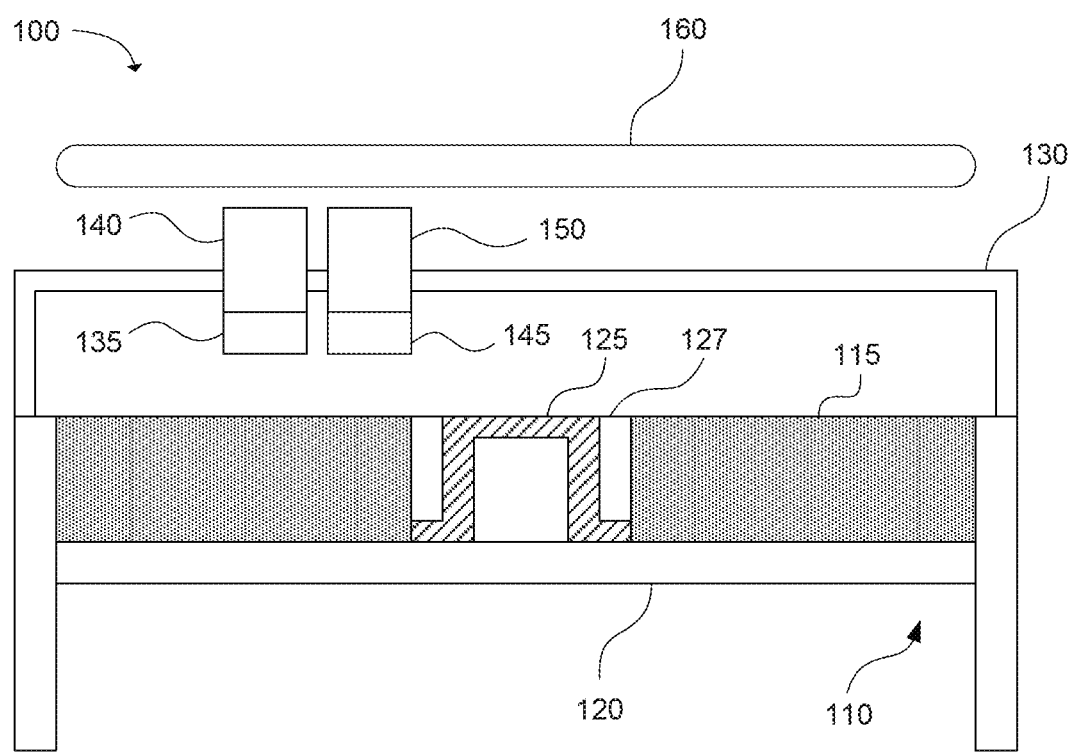
FIG. 1 is a schematic view of a 3-dimensional printing system in accordance with examples of the present disclosure.

The figures depict several examples of the presently disclosed technology. However, it should be understood that the present technology is not limited to the examples depicted.

DETAILED DESCRIPTION

The present disclosure is drawn to the area of 3-dimensional printing. More specifically, the present disclosure provides material sets and systems for printing 3-dimensional parts with electrically conductive features. In an exemplary printing process, a thin layer of polymer powder is spread on a bed to form a powder bed. A printing head, such as an inkjet print head, is then used to print a fusing ink over portions of the powder bed corresponding to a thin layer of the three dimensional object to be formed. Then the bed is exposed to a light source, e.g., typically the entire bed. The fusing ink absorbs more energy from the light than the unprinted powder. The absorbed light energy is converted to thermal energy, causing the printed portions of the powder to melt and coalesce. This forms a solid layer. After the first layer is formed, a new thin layer of polymer powder is spread over the powder bed and the process is repeated to form additional layers until a complete 3-dimensional part is printed. Such 3-dimensional printing processes can achieve fast throughput with good accuracy.

In some examples of the presently disclosed technology, an electrically conductive fusing ink can be used together with another fusing ink to form 3-dimensional printed parts with electrically conductive features. The conductive fusing ink can be jetted on portions of the powder bed that are desired to be conductive, and the other fusing ink can be jetting on other portions of the powder bed to form the other portions of the final printed part. The materials, systems, and methods described herein can be used to print parts having a wide variety of electrical configurations, such as embedded electrical elements and surface electrical elements. The present technology can also make it possible to form electrical elements enabled by 3-dimensional printing that are not possible using standard electronics manufacturing techniques, such as embedded coils, diagonal vias, and so on.

In some examples of the present disclosure, a material set, such as for 3-dimensional printing, can include a thermoplastic polymer powder, a conductive fusing ink, and a second fusing ink. The thermoplastic polymer powder can include powder particles with an average particle size from 20 µm to 100 µm. As used herein, "average" with respect to properties of particles refers to a number average unless otherwise specified. Accordingly, "average particle size" refers to a number average particle size. Additionally, "particle size" refers to the diameter of spherical particles, or to the longest dimension of non-spherical particles.

In certain examples, the polymer particles can have a variety of shapes, such as substantially spherical particles or irregularly-shaped particles. In some examples, the polymer powder can be capable of being formed into 3D printed parts with a resolution of 20 to 100 microns. As used herein, "resolution" refers to the size of the smallest feature that can be formed on a 3D printed part. The polymer powder can form layers from about 20 to about 100 microns thick, allowing the fused layers of the printed part to have roughly the same thickness. This can provide a resolution in the z-axis direction of about 20 to about 100 microns. The polymer powder can also have a sufficiently small particle size and sufficiently regular particle shape to provide about 20 to about 100 micron resolution along the x-axis and y-axis.

In some examples, the thermoplastic polymer powder can be colorless. For example, the polymer powder can have a white, translucent, or transparent appearance. When used with a colorless fusing ink, such polymer powders can provide a printed part that is white, translucent, or transparent. In other examples, the polymer powder can be colored for producing colored parts. In still other examples, when the polymer powder is white, translucent, or transparent, color can be imparted to the part by the fusing ink or another colored ink.

The thermoplastic polymer powder can have a melting or softening point from about 70° C. to about 350° C. In further examples, the polymer can have a melting or softening point from about 150° C. to about 200° C. A variety of thermoplastic polymers with melting points or softening points in these ranges can be used. For example, the polymer powder can be selected from the group consisting of nylon 6 powder, nylon 9 powder, nylon 11 powder, nylon 12 powder, nylon 66 powder, nylon 612 powder, polyethylene powder, thermoplastic polyurethane powder, polypropylene powder, polyester powder, polycarbonate powder, polyether ketone powder, polyacrylate powder, polystyrene powder, and mixtures thereof. In a specific example, the polymer powder can be nylon 12, which can have a melting point from about 175° C. to about 200° C. In another specific example, the polymer powder can be thermoplastic polyurethane.

The thermoplastic polymer particles can also in some cases be blended with a filler. The filler can include inorganic particles such as alumina, silica, or combinations thereof. When the thermoplastic polymer particles fuse together, the filler particles can become embedded in the polymer, forming a composite material. In some examples, the filler can include a free-flow agent, anti-caking agent, or the like. Such agents can prevent packing of the powder particles, coat the powder particles and smooth edges to reduce inter-particle friction, and/or absorb moisture. In some examples, a weight ratio of thermoplastic polymer particles to filler particles can be from 10:1 to 1:2 or from 5:1 to 1:1.

The material set can also include a conductive fusing ink. The conductive fusing ink can comprise a transition metal. When the conductive fusing ink is printed onto a layer of the thermoplastic polymer powder, the conductive ink can penetrate into the spaces between powder particles. The layer can then be cured by exposing the layer to electromagnetic radiation. The conductive fusing ink can facilitate fusing of the powder particles by absorbing energy from the electromagnetic radiation and converting the energy to heat. This raises the temperature of the powder above the melting or softening point of the thermoplastic polymer. Additionally, during printing, curing, or both, the transition metal in the conductive ink can form a conductive transition metal matrix that becomes interlocked with the fused thermoplastic polymer particles.

In some examples, the transition metal in the conductive ink can be in the form of elemental transition metal particles. The elemental transition metal particles can include, for example, silver particles, copper particles, gold particles, platinum particles, palladium particles, chromium particles, nickel particles, zinc particles, or combinations thereof. The particles can also include alloys of more than one transition metal, such as Au—Ag, Ag—Cu, Au—Cu, Au—Ni, Au—Ag—Cu, or Au—Ag—Pd.

In certain examples, other non-transition metals can be included in addition to the transition metal. The non-transition metals can include lead, tin, bismuth, indium, gallium, and others. In some examples, soldering alloys can be included. The soldering alloys can include alloys of lead, tin, bismuth, indium, zinc, gallium, silver, copper, in various combinations. In certain examples, such soldering alloys can be printed in locations that are to be used as soldering connections for printed electrical components. The soldering alloys can be formulated to have low melting temperatures useful for soldering, such as less than 230° C.

In certain examples, the elemental transition metal particles can be nanoparticles having an average particle size from 10 nm to 200 nm. In more specific examples, the elemental transition metal particles can have an average particle size from 30 nm to 70 nm.

As metal particles are reduced in size, the temperature at which the particles are capable of being sintered can also be reduced. Therefore, using elemental transition metal nanoparticles in the conductive fusing ink can allow the particles to sinter and form a conductive matrix of sintered nanoparticles at relatively low temperatures. For example, the elemental transition metal particles in the conductive fusing ink can be capable of being sintered at or below the temperature reached during curing in the 3-dimensional printing process. In a further example, the thermoplastic polymer powder bed can be heated to a preheat temperature during the printing process, and the elemental transition metal particles can be capable of being sintered at or below the preheat temperature. In still further examples, the elemental transition metal particles can be capable of being sintered at a temperature from 20° C. to 350° C. As used herein, the temperature at which the elemental transition metal particles are capable of being sintered refers to the lowest temperature at which the particles will become sintered together, forming a conductive matrix of sintered particles. It is understood that temperatures above this lowest temperature will also cause the particles to become sintered.

In additional examples of the conductive fusing ink, the transition metal can be in the form of elemental transition metal particles that are stabilized by a dispersing agent at surfaces of the particles. The dispersing agent can include ligands that passivate the surface of the particles. Suitable ligands can include a moiety that binds to the transition metal. Examples of such moieties can include sulfonic acid, phosphonic acid, carboxylic acid, dithiocarboxylic acid, phosphonate, sulfonate, thiol, carboxylate, dithiocarboxylate, amine, and others. In some cases, the dispersing agent can contain an alkyl group having from 3-20 carbon atoms, with one of the above moieties at an end of the alkyl chain. In certain examples, the dispersing agent can be an alkylamine, alkylthiol, or combinations thereof. In further examples, the dispersing agent can be a polymeric dispersing agent, such as polyvinylpyrrolidone (PVP), polyvinylalcohol (PVA), polymethylvinylether, poly(acrylic acid) (PAA), nonionic surfactants, polymeric chelating agents, and others. The dispersing agent can bind to the surfaces of the elemental transition metal particles through chemical and/or physical attachment. Chemical bonding can include a covalent bond, hydrogen bond, coordination complex bond, ionic bond, or combinations thereof. Physical attachment can include attachment through van der Waal's forces, dipole-dipole interactions, or a combination thereof.

In further examples, the conductive fusing ink can include a transition metal in the form of a metal salt or metal oxide. Under certain conditions, a transition metal salt or metal oxide in the conductive ink can form elemental transition metal particles in situ after being printed onto the thermoplastic polymer powder bed. The elemental transition metal particles thus formed can then be sintered together to form a conductive matrix. In some examples, a reducing agent can be reacted with the metal salt or metal oxide to produce elemental metal particles. In one example, a reducing agent can be underprinted onto the powder bed before the conductive fusing ink. In another example, a reducing agent can be overprinted over the conductive fusing ink. In either case, the reducing agent can be reacted with the metal salt or metal oxide to form elemental metal particles before the thermoplastic polymer particle layer is cured. Suitable reducing agents can include, for example, glucose, fructose, maltose, maltodextrin, trisodium citrate, ascorbic acid, sodium borohydride, ethylene glycol, 1,5-pentanediol, 1,2-propylene glycol, and others.

The concentration of transition metal in the conductive fusing ink can vary. However, higher transition metal concentrations can tend to provide better conductivity due to a larger amount of conductive material being deposited on the powder bed. In some examples, the conductive fusing ink can contain from about 5 wt % to about 50 wt % of the transition metal, with respect to the entire weight of the conductive fusing ink. In further examples, the conductive fusing ink can contain from about 10 wt % to about 30 wt % of the transition metal, with respect to the entire weight of the conductive fusing ink.

In some examples of the material sets according to the present technology, a pretreat ink can be used with the conductive fusing ink. The pretreat ink can include a chloride salt, such as sodium chloride or potassium chloride, for example. The chloride salt can react with dispersing agents at the surfaces of transition metal particles to remove the dispersing agents from the particles. This can increase the sintering between the metal particles and improve the conductivity of the matrix formed of the sintered particles. The pretreat ink can be dispensed onto the powder bed before the conductive fusing ink. When the conductive fusing ink is printed over the pretreat ink, the transition metal particles can come into contact with the chloride salt in the pretreat ink. In alternate examples, the polymer powder can be pretreated with a chloride salt before being used in the 3-dimensional printing system. When the conductive fusing ink is printed onto the powder bed, the transition metal particles in the conductive fusing ink can come into contact with the chloride salt already present on the powder.

Material sets in accordance with the present technology can also include a second fusing ink. In some examples, the second fusing ink can be devoid or substantially devoid of the transition metal contained in the conductive fusing ink. Thus, the second fusing ink can provide a lower conductivity than the conductive fusing ink when printed on the thermoplastic polymer powder. However, in some examples the second fusing ink can include metal particles that provide a lower conductivity than the transition metal in the conductive fusing ink. For example, the second fusing ink can include metal particles with passivated surfaces that do not sinter together to form a conductive matrix.

The second fusing ink can contain another fusing agent that is capable of absorbing electromagnetic radiation to produce heat. The fusing agent can be colored or colorless. In various examples, the fusing agent can be carbon black, near-infrared absorbing dyes, near-infrared absorbing pigments, tungsten bronzes, molybdenum bronzes, metal nanoparticles, or combinations thereof. Examples of near-infrared absorbing dyes include aminium dyes, tetraaryldiamine dyes, cyanine dyes, pthalocyanine dyes, dithiolene dyes, and others. In further examples, the fusing agent can be a near-infrared absorbing conjugated polymer such as poly(3,4-ethylenedioxythiophene)-poly(styrenesulfonate) (PEDOT:PSS), a polythiophene, poly(p-phenylene sulfide), a polyaniline, a poly(pyrrole), a poly(acetylene), poly(p-phenylene vinylene), polyparaphenylene, or combinations thereof. As used herein, "conjugated" refers to alternating double and single bonds between atoms in a molecule. Thus, "conjugated polymer" refers to a polymer that has a backbone with alternating double and single bonds. In many cases, the fusing agent can have a peak absorption wavelength in the range of 800 nm to 1400 nm.

The amount of fusing agent in the second fusing ink can vary depending on the type of fusing agent. In some examples, the concentration of fusing agent in the second fusing ink can be from 0,1 wt % to 20 wt %. In one example, the concentration of fusing agent in the second fusing ink can be from 0.1 wt % to 15 wt %. In another example, the concentration can be from 0.1 wt % to 8 wt %. In yet another example, the concentration can be from 0.5 wt % to 2 wt %. In a particular example, the concentration can be from 0.5 wt % to 1.2 wt %.

In some examples, the fusing ink can have a black or gray color due to the use of carbon black as the fusing agent. However, in other examples the fusing ink can be colorless or nearly colorless. The concentration of the fusing agent can be adjusted to provide a fusing ink in which the visible color of the fusing ink is not substantially altered by the fusing agent. Although some of the above described fusing agents have low absorbance in the visible light range, the absorbance is usually greater than zero. Therefore, the fusing agents can typically absorb some visible light, but their color in the visible spectrum can minimal enough that it does not substantially impact the ink's ability to take on another color when a colorant is added (unlike carbon black which dominates the ink's color with gray or black tones). The fusing agents in concentrated form can have a visible color, but the concentration of the fusing agents in the fusing ink can be adjusted so that the fusing agents are not present in such high amounts that they alter the visible color of the fusing ink. For example, a fusing agent with a very low absorbance of visible light wavelengths can be included in greater concentrations compared to a fusing agent with a relatively higher absorbance of visible light. These concentrations can be adjusted based on a specific application with some experimentation.

In further examples, the concentration of the fusing agent can be high enough that the fusing agent impacts the color of the fusing ink, but low enough that when the ink is printed on the thermoplastic polymer powder, the fusing agent does not impact the color of the powder. The concentration of the fusing agent can be balanced with the amount of fusing ink that is to be printed on the polymer powder so that the total amount of fusing agent that is printed onto the polymer powder is low enough that the visible color of the polymer powder is not impacted. In one example, the fusing agent can have a concentration in the fusing ink such that after the fusing ink is printed onto the polymer powder, the amount of fusing agent in the polymer powder is from 0.0003 wt % to 5 wt % with respect to the weight of the polymer powder.

The fusing agent can have a temperature boosting capacity sufficient to increase the temperature of the polymer powder above the melting or softening point of the polymer powder. As used herein, "temperature boosting capacity" refers to the ability of a fusing agent to convert near-infrared light energy into thermal energy to increase the temperature of the printed polymer powder over and above the temperature of the unprinted portion of the polymer powder. Typically, the polymer powder particles can be fused together when the temperature increases to the melting or softening temperature of the polymer. As used herein, "melting point" refers to the temperature at which a polymer transitions from a crystalline phase to a pliable, amorphous phase. Some polymers do not have a melting point, but rather have a range of temperatures over which the polymers soften. This range can be segregated into a lower softening range, a middle softening range and an upper softening range. In the lower and middle softening ranges, the particles can coalesce to form a part while the remaining polymer powder remains loose. If the upper softening range is used, the whole powder bed can become a cake. The "softening point," as used herein, refers to the temperature at which polymer particles coalesce while the remaining powder remains separate and loose. When the fusing ink is printed on a portion of the polymer powder, the fusing agent can heat the printed portion to a temperature at or above the melting or softening point, while the unprinted portions of the polymer powder remain below the melting or softening point. This allows the formation of a solid 3D printed part, while the loose powder can be easily separated from the finished printed part.

Although melting point and softening point are often described herein as the temperatures for coalescing the polymer powder, in some cases the polymer particles can coalesce together at temperatures slightly below the melting point or softening point. Therefore, as used herein "melting point" and "softening point" can include temperatures slightly lower, such as up to about 20° C. lower, than the actual melting point or softening point.

In one example, the fusing agent can have a temperature boosting capacity from about 10° C. to about 70° C. for a polymer with a melting or softening point from about 100° C. to about 350° C. If the powder bed is at a temperature within about 10° C. to about 70° C. of the melting or softening point, then such a fusing agent can boost the temperature of the printed powder up to the melting or softening point, while the unprinted powder remains at a lower temperature. In some examples, the powder bed can be preheated to a temperature from about 10° C. to about 70° C. lower than the melting or softening point of the polymer. The fusing ink can then be printed onto the powder and the powder bed can be irradiated with a near-infrared light to coalesce the printed portion of the powder.

In some examples of the material set according to the present technology, the conductive fusing ink and the second fusing ink can be balanced so that thermoplastic polymer powder that is printed with the conductive fusing ink and the second fusing ink reach nearly the same temperature when exposed to light during curing. The type and amount of fusing agent in the second fusing ink can be selected to match the temperature boosting capacity of the transition metal in the conductive fusing ink. The type and amount of transition metal in the conductive fusing ink can also be adjusted to match the temperature boosting capacity of the fusing agent in the second fusing ink. Additionally, in some examples the conductive fusing ink can contain another fusing agent other than the transition metal. In certain examples, the conductive fusing ink and the second fusing ink can raise the temperature of the thermoplastic polymer powder to temperatures within 30° C., within 20° C., or within 10° C. of each other during curing.

In further examples, the material set can also include colored inks for adding color to the thermoplastic polymer powder. This can allow for printing of full-color 3-dimensional parts. In one example, the material set can include cyan, magenta, yellow, and black inks in addition to the conductive fusing ink, second fusing ink, and pretreat ink if present.

Each of the conductive fusing ink, pretreat ink, second fusing ink, and additional colored inks can be formulated for use in an ink jet printer. The transition metal and fusing agents can be stable in an ink jet ink vehicle and the inks can provide good ink jetting performance. In some examples, the transition metal and fusing agents can be water-soluble, water-dispersible, organic-soluble, or organic-dispersible. The transition metal and fusing agents can also be compatible with the thermoplastic polymer powder so that jetting the inks onto the polymer powder provides adequate coverage and interfiltration of the transition metal and fusing agents into the powder.

Any of the above described inks can also include a pigment or dye colorant that imparts a visible color to the inks. In some examples, the colorant can be present in an amount from 0.5 wt % to 10 wt % in the inks. In one example, the colorant can be present in an amount from 1 wt % to 5 wt %. In another example, the colorant can be present in an amount from 5 wt % to 10 wt %. However, the colorant is optional and in some examples the inks can include no additional colorant. These inks can be used to print 3D parts that retain the natural color of the polymer powder. Additionally, the inks can include a white pigment such as titanium dioxide that can also impart a white color to the final printed part. Other inorganic pigments such as alumina or zinc oxide can also be used.

In some examples, the colorant can be a dye. The dye may be nonionic, cationic, anionic, or a mixture of nonionic, cationic, and/or anionic dyes. Specific examples of dyes that may be used include, but are not limited to, Sulforhodamine B, Acid Blue 113, Acid Blue 29, Acid Red 4, Rose Bengal, Acid Yellow 17, Acid Yellow 29, Acid Yellow 42, Acridine Yellow G, Acid Yellow 23, Acid Blue 9, Nitro Blue Tetrazolium Chloride Monohydrate or Nitro BT, Rhodamine 6G, Rhodamine 123, Rhodamine B, Rhodamine B isocyanate, Safranine O, Azure B, and Azure B Eosinate, which are available from Sigma-Aldrich Chemical Company (St. Louis, Mo.). Examples of anionic, water-soluble dyes include, but are not limited to, Direct Yellow 132, Direct Blue 199, Magenta 377 (available from Ilford AG, Switzerland), alone or together with Acid Red 52. Examples of water-insoluble dyes include azo, xanthene, methine, polymethine, and anthraquinone dyes. Specific examples of water-insoluble dyes include Orasol® Blue GN, Orasol® Pink, and Orasol® Yellow dyes available from Ciba-Geigy Corp. Black dyes may include, but are not limited to, Direct Black 154, Direct Black 168, Fast Black 2, Direct Black 171, Direct Black 19, Acid Black 1, Acid Black 191, Mobay Black SP, and Acid Black 2.

In other examples, the colorant can be a pigment. The pigment can be self-dispersed with a polymer, oligomer, or small molecule; or can be dispersed with a separate dispersant. Suitable pigments include, but are not limited to, the following pigments available from BASF: Paliogen®) Orange, Heliogen® Blue L 6901F, Heliogen®) Blue NBD 7010, Heliogen® Blue K 7090, Heliogen® Blue L 7101F, Paliogen®) Blue L 6470, Heliogen®) Green K 8683, and Heliogen® Green L 9140. The following black pigments are available from Cabot: Monarch® 1400, Monarch® 1300, Monarch®) 1100, Monarch® 1000, Monarch®) 900, Monarch® 880, Monarch® 800, and Monarch®) 700. The following pigments are available from CIBA: Chromophtal®) Yellow 3G. Chromophtal®) Yellow GR, Chromophtal®) Yellow 8G, Igrazin® Yellow 5GT, Igralite® Rubine 4BL, Monastral® Magenta, Monastral® Scarlet, Monastral® Violet R, Monastral® Red B, and Monastral® Violet Maroon B. The following pigments are available from Degussa: Printex® U, Printex® V, Printex® 140U, Printex® 140V, Color Black FW 200, Color Black FW 2, Color Black FW 2V, Color Black FW 1, Color Black FW 18, Color Black S 160, Color Black S 170, Special Black 6, Special Black 5, Special Black 4A, and Special Black 4. The following pigment is available from DuPont: Tipure®) R-101. The following pigments are available from Heubach: Dalamar® Yellow YT-858-D and Heucophthal Blue G XBT-583D. The following pigments are available from Clariant: Permanent Yellow GR, Permanent Yellow G, Permanent Yellow DHG, Permanent Yellow NCG-71, Permanent Yellow GG, Hansa Yellow RA, Hansa Brilliant Yellow 5GX-02, Hansa Yellow-X, Novoperm® Yellow HR, Novoperm® Yellow FGL, Hansa Brilliant Yellow 10GX, Permanent Yellow G3R-01, Hostaperm® Yellow H4G, Hostaperm® Yellow H3G, Hostaperm® Orange GR, Hostaperm® Scarlet GO, and Permanent Rubine F6B. The following pigments are available from Mobay: Quindo® Magenta, Indofast® Brilliant Scarlet, Quindo® Red R6700, Quindo® Red R6713, and Indofast® Violet. The following pigments are available from Sun Chemical: L74-1357 Yellow, L75-1331 Yellow, and L75-2577 Yellow. The following pigments are available from Columbian: Raven® 7000, Raven® 5750, Raven® 5250, Raven® 5000, and Raven® 3500. The following pigment is available from Sun Chemical: LHD9303 Black. Any other pigment and/or dye can be used that is useful in modifying the color of the above described inks and/or ultimately, the printed part.

The colorant can be included in the conductive fusing ink and/or the second fusing ink to impart color to the printed object when the fusing inks are jetted onto the powder bed. Optionally, a set of differently colored fusing inks can be used to print multiple colors. For example, a set of fusing inks including any combination of cyan, magenta, yellow (and/or any other colors), colorless, white, and/or black fusing inks can be used to print objects in full color. Alternatively or additionally, a colorless fusing ink can be used in conjunction with a set of colored, non-fusing inks to impart color. In some examples, a colorless fusing ink can be used to coalesce the polymer powder and a separate set of colored or black or white inks not containing a fusing agent can be used to impart color.

The components of the above described inks can be selected to give the inks good ink jetting performance and the ability to color the polymer powder with good optical density. Besides the transition metals, fusing agents, colorants and other ingredients described above, the inks can also include a liquid vehicle. In some examples, the liquid vehicle formulation can include water and one or more co-solvents present in total at from 1 wt % to 50 wt %, depending on the jetting architecture. Further, one or more non-ionic, cationic, and/or anionic surfactant can optionally be present, ranging from 0.01 wt % to 20 wt %. In one example, the surfactant can be present in an amount from 5 wt % to 20 wt %. The liquid vehicle can also include dispersants in an amount from 5 wt % to 20 wt %. The balance of the formulation can be purified water, or other vehicle components such as biocides, viscosity modifiers, materials for pH adjustment, sequestering agents, preservatives, and the like. In one example, the liquid vehicle can be predominantly water. In some examples, a water-dispersible or water-soluble fusing agent can be used with an aqueous vehicle. Because the fusing agent is dispersible or soluble in water, an organic co-solvent is not necessary to solubilize the fusing agent. Therefore, in some examples the inks can be substantially free of organic solvent. However, in other examples a co-solvent can be used to help disperse other dyes or pigments, or improve the jetting properties of the ink. In still further examples, a non-aqueous vehicle can be used with an organic-soluble or organic-dispersible fusing agent.

In certain examples, a high boiling point co-solvent can be included in the inks. The high boiling point co-solvent can be an organic co-solvent that boils at a temperature higher than the temperature of the powder bed during printing. In some examples, the high boiling point co-solvent can have a boiling point above 250° C. In still further examples, the high boiling point co-solvent can be present in the ink at a concentration from about 1 wt % to about 4 wt %.

Classes of co-solvents that can be used can include organic co-solvents including aliphatic alcohols, aromatic alcohols, diols, glycol ethers, polyglycol ethers, capro- lactams, formamides, acetamides, and long chain alcohols. Examples of such compounds include primary aliphatic alcohols, secondary aliphatic alcohols, 1,2-alcohols, 1,3-alcohols, 1,5-alcohols, ethylene glycol alkyl ethers, propylene glycol alkyl ethers, higher homologs ($C_6$-$C_{12}$) of polyethylene glycol alkyl ethers, N-alkyl caprolactams, unsubstituted caprolactams, both substituted and unsubstituted formamides, both substituted and unsubstituted acetamides, and the like. Specific examples of solvents that can be used include, but are not limited to, 2-pyrrolidinone, N-methylpyrrolidone, 2-hydroxyethyl-2-pyrrolidone, 2-methyl-1,3-propanediol, tetraethylene glycol, 1,6-hexanediol, 1,5-hexanediol and 1,5-pentanedial.

One or more surfactants can also be used, such as alkyl polyethylene oxides, alkyl phenyl polyethylene oxides, polyethylene oxide block copolymers, acetylenic polyethylene oxides, polyethylene oxide (di)esters, polyethylene oxide amines, protonated polyethylene oxide amines, protonated polyethylene oxide amides, dimethicone copolyols, substituted amine oxides, and the like. The amount of surfactant added to the formulation of this disclosure may range from 0.01 wt % to 20 wt %. Suitable surfactants can include, but are not limited to, liponic esters such as Tergitol™ 15-S-12, Tergitol™ 15-S-7 available from Dow Chemical Company, LEG-1 and LEG-7; Triton™ X-100; Triton™ X-405 available from Dow Chemical Company; and sodium dodecylsulfate.

Consistent with the formulation of this disclosure, various other additives can be employed to optimize the properties of the ink compositions for specific applications. Examples of these additives are those added to inhibit the growth of harmful microorganisms. These additives may be biocides, fungicides, and other microbial agents, which are routinely used in ink formulations. Examples of suitable microbial agents include, but are not limited to, Nuosept® (Nudex, Inc.), Ucarcide™ (Union carbide Corp.), Vancide® (R.T. Vanderbilt Co.), Proxel® (ICI America), and combinations thereof.

Sequestering agents, such as EDTA (ethylene diamine tetra acetic acid), may be included to eliminate the deleterious effects of heavy metal impurities, and buffer solutions may be used to control the pH of the ink. From 0.01 wt % to 2 wt %, for example, can be used. Viscosity modifiers and buffers may also be present, as well as other additives to modify properties of the ink as desired. Such additives can be present at from 0.01 wt % to 20 wt %.

In one example, the liquid vehicle can include the components and amounts as shown in Table 1:

TABLE 1

| Ingredients | Wt. (%) |
| --- | --- |
| 2-Pyrrolidinone | 50-75 |
| 2-Methyl-1,3-Propanediol | 5-12 |
| Tetraethylene glycol | 5-12 |
| LEG-1 | 5-10 |
| Surfynol ® CT151 surfactant from Air Products and Chemicals, Inc. | 0.2-1.2 |
| Zonyl ® FSO fluorosurfactant from DuPont | 0.01-1 |
| SMA1440H | 1-5 |
| Tris base | 0.1-1 |

In another example, the liquid vehicle can include the components and amounts as shown in Table 2:

TABLE 2

| Ink Components | Wt. (%) |
| --- | --- |
| 2-Pyrrolidinone | 50-99.9 |
| Crodafos N3 ™ surfactant from Croda | 0.1-5 |

In yet another example, the liquid vehicle can include the components and amounts as shown in Table 3:

TABLE 3

| Component | Wt % |
| --- | --- |
| 2-methyl-1,3-propanediol | 10-40 |
| Crodafos N3 ™ surfactant from Croda | 0.1-5 |
| Tergitol ™ 15-S-12 surfactant from Dow Chemical Company | 0.1-3 |
| Zonyl ® FSO-100 fluorosurfactant from DuPont | 0.5-5 |
| Proxel ™ GXL (20% as is) biocide from Lonza | 0.1-1 |

In still another example, the liquid vehicle can include the components and amounts as shown in Table 4:

TABLE 4

| Component | Wt % |
| --- | --- |
| 2-Hydroxyethyl-2-Pyrrolidone | 5-20 |
| Dantocol ™ DHE bonding agent from Lonza | 30-80 |
| LEG | 1-20 |
| Crodafos N3 ™ surfactant from Croda | 1-20 |
| Surfynol ® SEF (75% as is) surfactant from Air Products and Chemicals, inc. | 1-10 |
| Kordek ™ MLX (10% as is) biocide from Dow Chemical Company | 0.1-5 |
| Proxel ™ GXL (20% as is) biocide from Lonza | 0.1-5 |

In a further example, the liquid vehicle can include the components and amounts as shown in Table 5:

TABLE 5

| Ink vehicle components | Wt % |
| --- | --- |
| Tripropylene glycol | 20-60 |
| 1-(2-Hydroxyethyl)-2-imidazolidinone | 20-40 |
| LEG-1 | 0.5-5 |
| Crodafos N3 ™ surfactant from Croda | 1-6 |
| Tergitol ™ 15-S-7 surfactant from Dow Chemical Company | 1-6 |
| Zonyl ® FSO fluorosurfactant from DuPont | 0.1-1.2 |
| Proxel ™ GXL biocide from Lonza | 0.1-1.2 |

In yet another example, the liquid vehicle can include the components and amounts shown in Table 6:

TABLE 6

| Ink vehicle components | Wt % |
| --- | --- |
| Ethylene glycol | 65-96.9 |
| Ethanol | 3-20 |
| Isopropyl alcohol | 0.1-15 |

It is noted the liquid vehicle formulations of Tables 1 to 6 are provided by example only and other formulations with similar properties can likewise be formulated in accordance with the present technology.

In addition to the material sets described above, the present technology also encompasses 3-dimensional printing systems that include the material sets. An example of a 3-dimensional printing system 100 is shown in FIG. 1. The system includes a powder bed 110 comprising a thermoplastic polymer powder 115 having an average particle size from 20 µm to 100 µm. In the example shown, the powder bed has a movable floor 120 that allows the powder bed to be lowered after each layer of the 3-dimensional part is printed. The 3-dimensional part can include a conductive portion 125 and an insulating portion 127. The system also includes an inkjet printer 130 that includes a first inkjet pen 135 in communication with a reservoir of a conductive fusing ink 140. The first inkjet pen can be configured to print the conductive fusing ink onto the powder bed. A second inkjet pen 145 is in communication with a reservoir of a second fusing ink 150. The second inkjet pen can be configured to print the second fusing ink onto the powder bed. After the fusing inks have been printed onto the powder bed, a fusing lamp 160 can be used to expose the powder bed to electromagnetic radiation sufficient to fuse the powder that has been printed with the fusing inks.

The material set used in the 3-dimensional printing system can include any of the components and ingredients described above. In a particular example, the conductive fusing ink can include elemental transition metal particles that are silver particles, copper particles, gold particles, or combinations thereof. In a further example, the elemental transition metal particles can have an average particle size from 10 nm to 200 nm. In another example, the fusing agent in the second fusing ink can include carbon black, a near-infrared absorbing dye, a near-infrared absorbing pigment, a tungsten bronze, a molybdenum bronze, metal nanoparticles, a conjugated polymer, or combinations thereof.

In some examples, the 3-dimensional printing system can also include a third inkjet pen in communication with a reservoir of a pretreat ink to print the pretreat ink onto the powder bed. The pretreat ink can include an aqueous solution of sodium chloride, potassium chloride, or combinations thereof. In further examples, the 3-dimensional printing system can include additional inkjet pens for colored inks as described above.

To achieve good selectivity between the fused and unfused portions of the powder bed, the fusing inks can absorb enough energy to boost the temperature of the thermoplastic polymer powder above the melting or softening point of the polymer, while unprinted portions of the powder bed remain below the melting or softening point. In some examples, the 3-dimensional printing system can include preheaters for preheating the thermoplastic polymer powder to a temperature near the melting or softening point. In one example, the system can include a print bed heater to heat the print bed during printing. The preheat temperature used can depend on the type of thermoplastic polymer used. In some examples, the print bed heater can heat the print bed to a temperature from 130° C. to 160° C. The system can also include a supply bed, where polymer particles are store before being spread in a layer onto the print bed. The supply bed can have a supply bed heater. In some examples, the supply bed heater can heat the supply bed to a temperature from 90° C. to 140° C.

Suitable fusing lamps for use in the 3-dimensional printing system can include commercially available infrared lamps and halogen lamps. The fusing lamp can be a stationary lamp or a moving lamp. For example, the lamp can be mounted on a track to move horizontally across the powder bed. Such a fusing lamp can make multiple passes over the bed depending on the amount of exposure needed to coalesce each printed layer. The fusing lamp can be configured to irradiate the entire powder bed with a substantially uniform amount of energy. This can selectively coalesce the printed portions with fusing inks leaving the unprinted portions of the polymer powder below the melting or softening point.

In one example, the fusing lamp can be matched with the fusing agents in the fusing inks so that the fusing lamp emits wavelengths of light that match the peak absorption wavelengths of the fusing agents. A fusing agent with a narrow peak at a particular near-infrared wavelength can be used with a fusing lamp that emits a narrow range of wavelengths at approximately the peak wavelength of the fusing agent. Similarly, a fusing agent that absorbs a broad range of near-infrared wavelengths can be used with a fusing lamp that emits a broad range of wavelengths. Matching the fusing agent and the fusing lamp in this way can increase the efficiency of coalescing the polymer particles with the fusing agent printed thereon, while the unprinted polymer particles do not absorb as much light and remain at a lower temperature.

Depending on the amount of fusing agent present in the polymer powder, the absorbance of the fusing agent, the preheat temperature, and the melting or softening point of the polymer, an appropriate amount of irradiation can be supplied from the fusing lamp. In some examples, the fusing lamp can irradiate each layer from about 0.5 to about 10 seconds per pass.

The present technology also extends to 3-dimensional printed parts formed from the materials described herein. In one example, a 3-dimensional printed part can include a conductive composite portion comprising a matrix of fused thermoplastic polymer particles interlocked with a matrix of sintered elemental transition metal particles, and an insulating portion comprising a matrix of fused thermoplastic polymer particles that is continuous with the matrix of fused thermoplastic polymer particles in the conductive composite portion. The insulating portion can be substantially free of sintered elemental transition metal particles.

Figure 2:
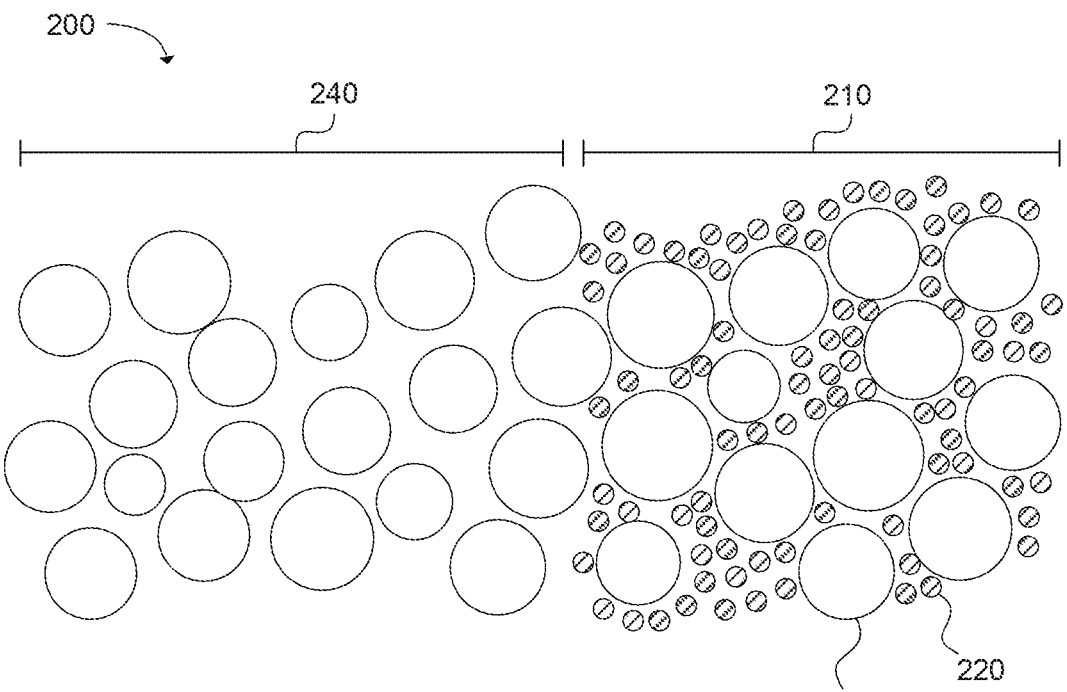
FIG. 2 is a close-up side cross-sectional view of a layer of thermoplastic polymer powder with a conductive fusing ink printed on a portion of the layer in accordance with examples of the present disclosure.
Figure 3:
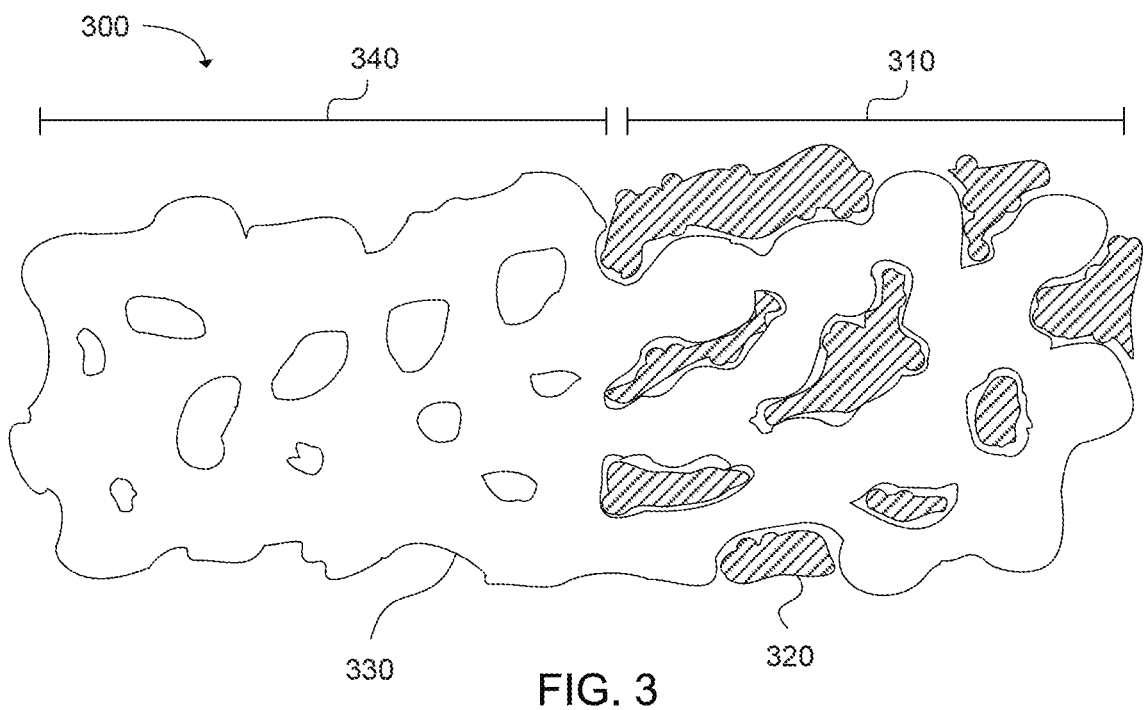
FIG. 3 is a close-up side cross-sectional view of the layer of FIG. 2 after the layer has been cured in accordance with examples of the present disclosure.

The formation of the conductive composite described above is illustrated in FIGS. 2-3. FIGS. 2-3 are close-up cross sectional views of a layer of the thermoplastic polymer powder bed that has been printed with a conductive fusing ink and a second fusing ink. FIG. 2 shows the powder layer 200 after being printed but before being cured, and FIG. 3 shows the coalesced powder layer 300 after being cured. In FIG. 2, a first portion 210 of the powder layer 200 has been printed with a conductive fusing ink containing transition metal particles 220. The transition metal particles penetrate into the spaces between the powder particles 230. A second portion 240 of the powder layer has been printed with a second fusing ink including another fusing agent. It should be noted that these figures are not necessarily drawn to scale, and the relative sizes of powder particles and transition metal particles can differ from those shown. For example, in many cases the transition metal particles can be much smaller than the powder particles, such as 2-3 orders of magnitude smaller.

When the powder layer 200 is cured by exposure to electromagnetic radiation, the transition metal particles in the first portion 310 sinter together to form a matrix of sintered metal particles 320 as shown in FIG. 3. The thermoplastic polymer particles 230 fuse together in the second portion 340, forming a matrix of fused thermoplastic polymer particles 330. The matrix of sintered metal particles and the matrix of fused thermoplastic polymer particles are interlocked, forming the conductive composite. It should be noted that FIG. 3 shows only a 2-dimensional cross-section of the conductive composite. Although the sintered metal particles appear to be in isolated locations in the figure, the matrix of sintered metal particles can be a continuously connected matrix in three dimensions. Thus, the conductive composite can have good electrical conductivity through the matrix of sintered transition metal particles.

In some examples, the conductive composite can have sufficient electrical conductivity to be used to form electrical components. The resistance of the conductive composite can be tuned in a variety of ways. For example, the resistance can be affected by the type of transition metal in the conductive fusing ink, the concentration of the transition metal in the conductive fusing ink, the amount of conductive fusing ink dispensed onto the powder bed, the cross section and length of the conductive portion of the 3-dimensional printed part, and so on. When the conductive fusing ink is dispensed by ink jetting, the amount of conductive fusing ink dispensed can be adjusted by changing print speed, drop weight, number of slots from which the ink is fired in the ink jet printer, and number of passes printed per powder layer. In certain examples, a conductive composite element can have a resistance from 1 ohm to 5 Mega ohms.

Sufficient conductivity can be achieved by dispensing a sufficient amount of the transition metal onto the powder bed. In some examples, a sufficient mass of the transition metal per volume of the conductive composite can be used to achieve conductivity. For example, the mass of transition metal per volume of conductive composite can be greater than 1 mg/cm$^3$, greater than 10 mg/cm$^3$, greater than 50 mg/cm$^3$, or greater than 100 mg/cm$^3$. In a particular example, the mass of transition metal per volume of the conductive composite can be greater than 140 mg/cm$^3$. In further examples, the mass of transition metal per volume of conductive composite can be from 1 mg/cm$^3$ to 1000 mg/cm$^3$, from 10 mg/cm$^3$ to 1000 mg/cm$^3$, from 50 mg/cm$^3$ to 500 mg/cm$^3$, or from 100 mg/cm$^3$ to 500 mg/cm$^3$.

In certain examples, a smaller amount of transition metal can be dispensed to achieve surface conductivity, and a larger amount of transition metal can be applied to achieve bulk conductivity in the conductive composite. Thus, electrical traces can be printed with a smaller amount of transition metal and electrical vias can be printed with a larger amount of transition metal. As used herein, "trace" refers to an electrically conductive element which conducts electricity along an x-y plane in the 3-dimensional printed part. The x-y plane refers to the plane that contains each layer of the powder bed as the layers are printed. Thus, traces can be oriented along one of the layers that make up the final 3-dimensional printed part. In various examples, traces can be on a surface of the final 3-dimensional printed part or embedded within the part. In some examples, traces can be formed with a mass of transition metal per volume of conductive composite that is greater than 1 mg/cm$^3$ or greater than 10 mg/cm$^3$. In further examples, traces can be formed with a mass of transition metal per volume of conductive composite from 1 mg/cm$^3$ to 1000 mg/cm$^3$, 10 mg/cm$^3$ to 500 mg/cm$^3$, or 30 mg/cm$^3$ to 200 mg/cm$^3$.

As used herein, "via" refers to an electrical element that conducts electricity in the z-axis direction. The z-axis refers to the axis orthogonal to the x-y plane. For example, in 3-dimensional printing systems having a powder bed floor that lowers after each layer is printed, the z-axis is the direction in which the floor is lowered. Vias can be formed vertically so that that they conduct electricity in only the z-axis direction. Alternatively, vias can be formed in a diagonal direction that includes components of the z-axis direction and the x- and/or y-axis directions. In some examples, vias can be formed with a mass of transition metal per volume of conductive composite that is greater than 50 mg/cm$^3$ or greater than 100 mg/cm$^3$. In further examples, vias can be formed with a mass of transition metal per volume of conductive composite from 50 mg/cm$^3$ to 1000 mg/cm$^3$, 100 mg/cm$^3$ to 1000 mg/cm$^3$, or 140 mg/cm$^3$ to 500 mg/cm$^3$.

In some examples, the amount of transition metal dispensed onto the powder bed can be adjusted by printing the conductive fusing ink in multiple passes. In one example, a single pass of an inkjet printhead can be sufficient to dispense enough transition metal to achieve surface conductivity. However, in some cases, a single pass is not sufficient to achieve conductivity in the z-axis direction. Additional passes can be applied to increase the amount of transition metal in the transition metal composite. A sufficient number of passes can be used to achieve conductivity in the z-axis direction. In one example, three or more passes can be used to form a conductive composite with conductivity in the z-axis direction. In further examples, the amount of transition metal dispensed can be adjusted by adjusting the drop weight of the inkjet printhead either through resistor design or by changing firing parameters. Thus, with a greater drop weight, a greater amount of the conductive fusing ink can be printed with each drop fired. However, in some cases jetting too large an amount of ink in a single pass can lead to lower print quality because of ink spreading. Therefore, in some examples multiple passes can be used to print more of the conductive fusing ink with better print quality.

In a particular example, a 3-dimensional printed part can be formed as follows. An inkjet printer can be used to print a first pass including printing a conductive fusing ink onto a first portion of the powder bed and printing a second fusing ink onto a second portion of the powder bed. A curing pass can then be performed by passing a fusing lamp over the powder bed to fuse the polymer particles and sinter transition metal particles in the conductive curing ink. Then, one or more additional passes can be performed of printing the conductive fusing ink onto the first portion of the powder bed to increase the amount of transition metal. Each pass of printing the conductive fusing ink can be followed by a curing pass with the fusing lamp. The number of passes used can depend on the desired conductivity, the contone level of the printing passes (referring to the density of ink per area deposited on each pass), the type of transition metal in the conductive fusing ink, concentration of transition metal in the conductive fusing ink, thickness of the layer of polymer powder being printed, and so on.

Figure 4:
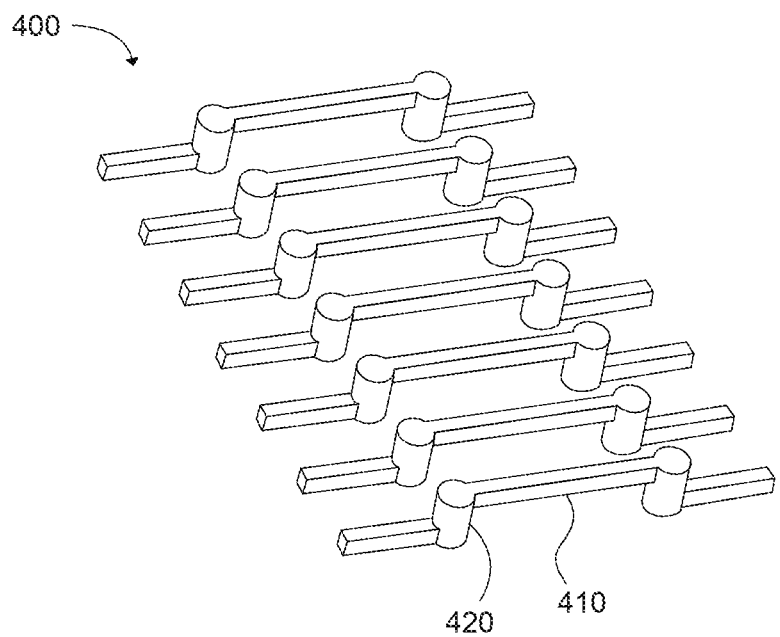
FIG. 4 is a diagonal view of traces and vias formed of a conductive composite in accordance with examples of the present disclosure.
Figure 5:
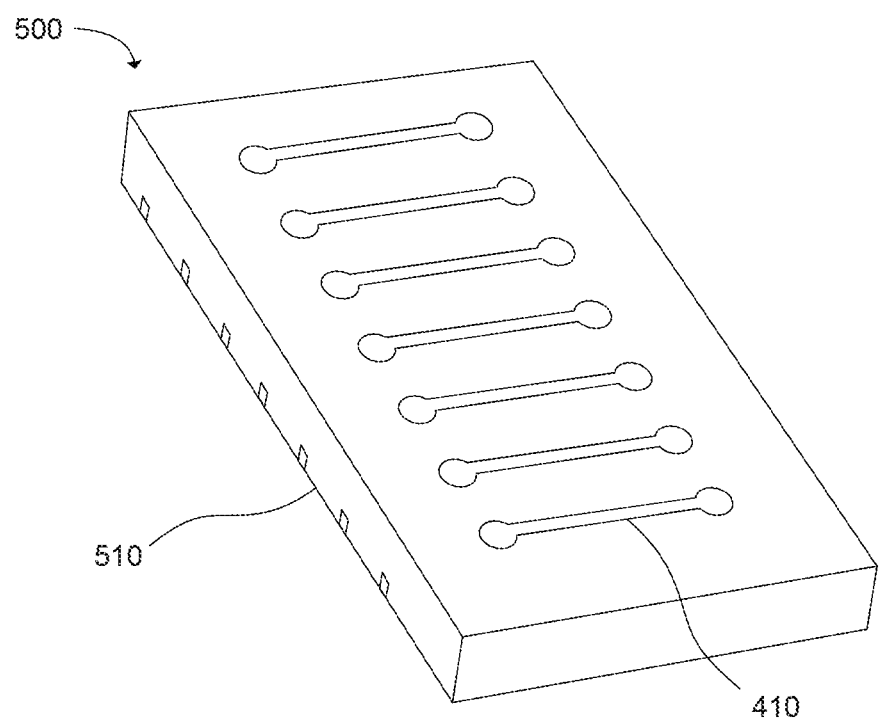
FIG. 5 is a diagonal view of a 3-dimensional printed part having embedded traces and vias in accordance with examples of the present disclosure.

FIG. 4 shows an example of a 3-dimensional printed conductive composite 400 that includes traces 410 in the x-axis direction and vias 420 in the z-axis direction. FIG. 5 shows a 3-dimensional printed part 500 that includes the same 3-dimensional printed conductive composite 400 embedded in an insulating portion 510. The traces 410 are accessible at the top and bottom surfaces of the part, and the vias 420 connect the traces on the top and bottom surfaces.

Figure 6:
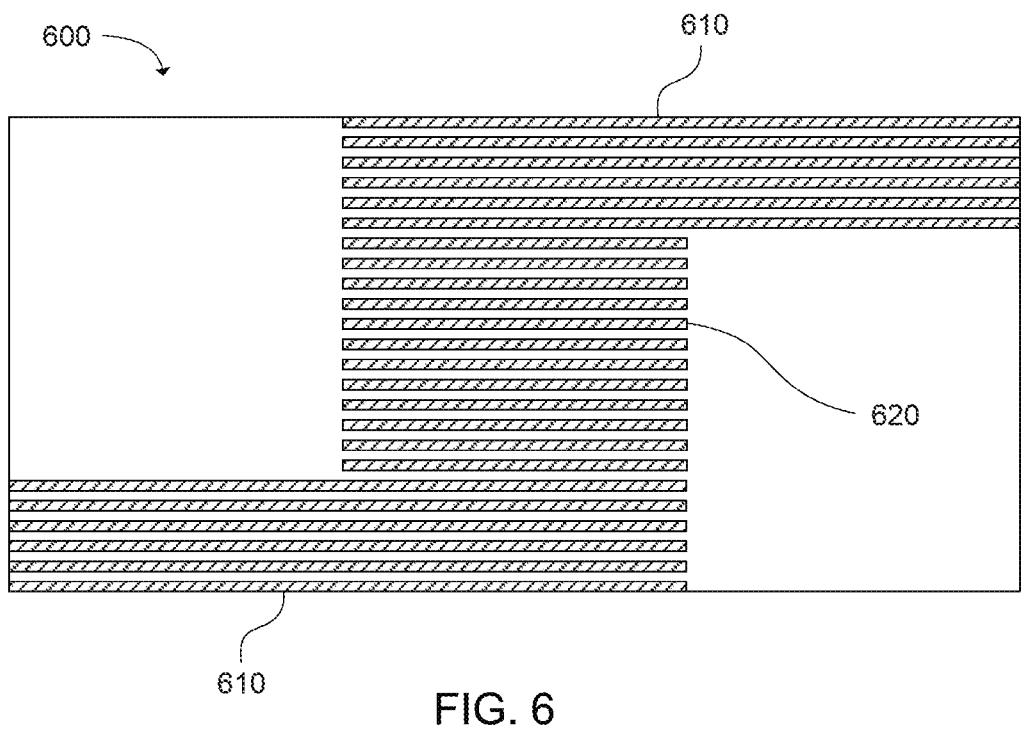
FIG. 6 is a side cross-sectional view of a 3-dimensional printed part having embedded traces and a via in accordance with examples of the present disclosure.
Figure 7:
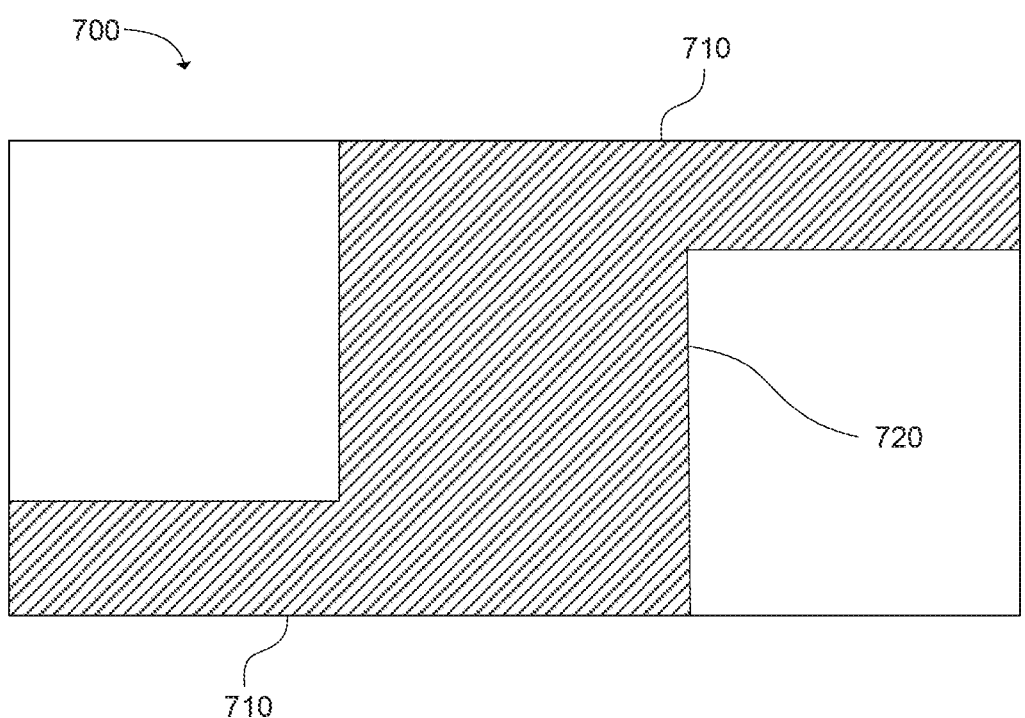
FIG. 7 is a side cross-sectional view of a 3-dimensional printed part having embedded traces and a via in accordance with examples of the present disclosure.

FIG. 6 shows a cross-sectional side view of a 3-dimensional printed part 600 having traces 610 and an attempted via 620. However, in this figure, though the x- and/or y-axis surface traces are sufficiently electrically conductive, the attempted via does not have a sufficient electrical conductivity because the transition metal printed on each layer was not sufficient to penetrate through to the layer underneath. Thus, the form of the traces and vias includes discrete conductive layers that have conductivity in the x-axis direction, but not in the z-axis direction. FIG. 7 shows a cross-sectional side view of a similar 3-dimensional printed part 700 in which a sufficient amount of transition metal was printed to penetrate through the layers, forming a via 720 that has conductivity in the z-axis direction. Additionally, traces 710 that have conductivity in the x- and/or y-axis direction(s) are also formed.

It is noted that, as used in this specification and the appended claims, the singular forms "a," "an," and "the" include plural referents unless the context clearly dictates otherwise.

As used herein, "liquid vehicle" or "ink vehicle" refers to a liquid fluid in which additives are placed to form inkjettable fluids, such as inks. A wide variety of liquid vehicles may be used in accordance with the technology of the present disclosure. Such liquid or ink vehicles may include a mixture of a variety of different agents, including, surfactants, solvents, co-solvents, anti-kogation agents, buffers, biocides, sequestering agents, viscosity modifiers, surface-active agents, water, etc. Though not part of the liquid vehicle per se, in addition to the colorants and fusing agents, the liquid vehicle can carry solid additives such as polymers, latexes, UV curable materials, plasticizers, salts, etc.

As used herein, "colorant" can include dyes and/or pigments.

As used herein, "dye" refers to compounds or molecules that absorb electromagnetic radiation or certain wavelengths thereof. Dyes can impart a visible color to an ink if the dyes absorb wavelengths in the visible spectrum.

As used herein, "pigment" generally includes pigment colorants, magnetic particles, aluminas, silicas, and/or other ceramics, organo-metallics or other opaque particles, whether or not such particulates impart color. Thus, though the present description primarily exemplifies the use of pigment colorants, the term "pigment" can be used more generally to describe not only pigment colorants, but other pigments such as organometallics, ferrites, ceramics, etc. In one specific aspect, however, the pigment is a pigment colorant.

As used herein, "soluble," refers to a solubility percentage of more than 5 wt %.

As used herein, "ink jetting" or "jetting" refers to compositions that are ejected from jetting architecture, such as ink-jet architecture. Ink-jet architecture can include thermal or piezo architecture. Additionally, such architecture can be configured to print varying drop sizes such as less than 10 picoliters, less than 20 picoliters, less than 30 picoliters, less than 40 picoliters, less than 50 picoliters, etc.

As used herein, the term "substantial" or "substantially" when used in reference to a quantity or amount of a material, or a specific characteristic thereof, refers to an amount that is sufficient to provide an effect that the material or characteristic was intended to provide. The exact degree of deviation allowable may in some cases depend on the specific context.

As used herein, the term "about" is used to provide flexibility to a numerical range endpoint by providing that a given value may be "a little above" or "a little below" the endpoint. The degree of flexibility of this term can be dictated by the particular variable and determined based on the associated description herein.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include individual numerical values or sub-ranges encompassed within that range as if each numerical value and sub-range is explicitly recited. As an illustration, a numerical range of "about 1 wt % to about 5 wt %" should be interpreted to include not only the explicitly recited values of about 1 wt % to about 5 wt %, but also include individual values and sub-ranges within the indicated range. Thus, included in this numerical range are individual values such as 2, 3.5, and 4 and sub-ranges such as from 1-3, from 2-4, and from 3-5, etc. This same principle applies to ranges reciting only one numerical value. Furthermore, such an interpretation should apply regardless of the breadth of the range or the characteristics being described.

EXAMPLES

The following illustrates examples of the present disclosure. However, it is to be understood that the following are only illustrative of the application of the principles of the present disclosure. Numerous modifications and alternative compositions, methods, and systems may be devised without departing from the spirit and scope of the present disclosure. The appended claims are intended to cover such modifications and arrangements.

Example 1

A 3-dimensional printing system was used to print a 25×40×3 mm coupon with embedded traces and vias. A conductive fusing ink, pretreat ink, and second fusing ink were printed from three separate ink jet pens. The conductive fusing ink was a silver ink (Mitsubishi NBSIJ-MU01) containing silver nanoparticles. The silver nanoparticles had an average particle size of approximately 20 nm. The pretreat ink was a solution of 3 wt % sodium chloride in water. The second fusing ink included carbon black as the fusing agent and an aqueous ink vehicle.

The inks were jetted onto a bed of nylon (PA12) particles (Vestosint®×1556). The nylon particles had an average particle size of approximately 50 μm. The layer thickness was approximately 100 μm. Each layer was printed with the pretreat ink followed by the silver ink in the conductive portions, and the carbon black fusing ink in the insulating portions. The inks were printed at contone levels of 255 for the silver ink, 255 for the pretreat ink, and 15 for the carbon black ink. A single pass of silver ink was printed per layer. Using these settings, the amount of solid silver dispensed onto the powder was 47 mg/cm$^3$ of the powder layer; the amount of chloride salt dispensed was 7.7 mg/cm$^3$ of the powder layer; and the amount of carbon black dispensed was 4 mg/cm$^3$ of the powder layer.

The printer powder supply and powder bed were filled with the nylon particles. The supply temperature was set at 110° C. and the print bed temperature was set at 130° C. A heater under the print bed was set at 150° C. The print speed was set at 10 inches per second (ips) and the cure speed was set at 7 ips. Curing was performed using two 300 W bulbs placed approximately 1 cm away from the surface of the powder bed.

The printed coupon was designed with conductive traces on the top and bottom face, with a conductive via connecting the traces. In the final printed coupon, the traces were conductive in the x-axis direction, along the surfaces of the traces. However, no conductivity was detected across the via in the z-axis direction, similar to that shown in FIG. 6. X-ray images of the coupon showed that the silver ink had formed conductive layers sandwiches between insulating polymer layers.

Example 2

A second coupon was printed using the same method described in Example 1, except that 3 passes of the silver ink, pretreat ink, and carbon black ink were performed for each layer. After each pass with the inks, a curing pass was performed. The amount of carbon black printed was reduced to prevent overheating of the insulating portions of the printed layer due to the three curing passes. In this example, the amount of solid silver dispensed onto the powder was 141 mg/cm$^3$ of the powder layer; the amount of chloride salt dispensed was 23 mg/cm$^3$ of the powder layer; and the amount of carbon black dispensed was 2.3 mg/cm$^3$ of the powder layer. The final printed coupon was conductive along the traces and across the via, in both the x-y plane and in the z-axis direction, similar to that shown in FIG. 7.

What is claimed is:

1. A material set, comprising:
    a thermoplastic polymer powder having an average particle size from 20 μm to 100 μm;
    a conductive fusing ink comprising a transition metal; and
    a second fusing ink comprising a fusing agent capable of absorbing electromagnetic radiation to produce heat, wherein the second fusing ink provides a lower conductivity than the conductive fusing ink when printed on the thermoplastic polymer powder.

2. The material set of claim 1, wherein the fusing agent comprises carbon black, a near-infrared absorbing dye, a near-infrared absorbing pigment, a tungsten bronze, a molybdenum bronze, metal nanoparticles, a conjugated polymer, or combinations thereof.

3. The material set of claim 1, further comprising a pretreat ink comprising an aqueous solution of sodium chloride, potassium chloride, or combinations thereof.

4. The material set of claim 3, wherein the transition metal is in the form of elemental transition metal particles comprising a dispersing agent at surfaces of the elemental transition metal particles, wherein the dispersing agent is capable of being removed from the surfaces by contact with the sodium chloride, potassium chloride, or combinations thereof.

5. The material set of claim 1, wherein the transition metal is in the form of elemental transition metal particles.

6. The material set of claim 5, wherein the elemental transition metal particles comprise silver particles, copper particles, gold particles, or combinations thereof.

7. The material set of claim 5, wherein the elemental transition metal particles have an average particle size from 10 nm to 200 nm.

8. The material set of claim 5, wherein the elemental transition metal particles are capable of being sintered at a temperature from 20° C. to 350° C.

9. A 3-dimensional printing system including the material set of claim 1, comprising:
    a powder bed comprising the thermoplastic polymer powder;
    an inkjet printer comprising:
        a first inkjet pen in communication with a reservoir of the conductive fusing ink to print the conductive fusing ink onto the powder bed, and a second inkjet pen in communication with a reservoir of the second fusing ink to print the second fusing ink onto the powder bed; and a fusing lamp to expose the powder bed to electromagnetic radiation sufficient to fuse thermoplastic polymer powder that has been printed with the conductive fusing ink, the second fusing ink, or both.

10. The system of claim 9, wherein the fusing agent comprises carbon black, a near-infrared absorbing dye, a near-infrared absorbing pigment, a tungsten bronze, a molybdenum bronze, metal nanoparticles, a conjugated polymer, or combinations thereof.

11. The system of claim 9, further comprising a third inkjet pen in communication with a reservoir of a pretreat ink to print the pretreat ink onto the powder bed, wherein the pretreat ink comprises an aqueous solution of sodium chloride, potassium chloride, or combinations thereof.

12. The system of claim 9, wherein the transition metal is in the form of elemental transition metal particles.

13. The system of claim 9, wherein the elemental transition metal particles have an average particle size from 10 nm to 200 nm.

* * * * *